US012618665B2

(12) United States Patent
Yang et al.

(10) Patent No.: US 12,618,665 B2
(45) Date of Patent: May 5, 2026

(54) NON-ZERO ANGLE ORIENTATION OF AN EMITTER ARRAY RELATIVE TO A RECTILINEAR AXIS OF A SUBMOUNT

(71) Applicant: Lumentum Operations LLC, San Jose, CA (US)

(72) Inventors: Lei Yang, Albuquerque, NM (US); John Michael Miller, Ottawa (CA); Lijun Zhu, Pleasanton, CA (US)

(73) Assignee: Lumentum Operations LLC, San Jose, CA (US)

( * ) Notice: Subject to any disclaimer, the term of this patent is extended or adjusted under 35 U.S.C. 154(b) by 1142 days.

(21) Appl. No.: 17/648,656

(22) Filed: Jan. 21, 2022

(65) Prior Publication Data

US 2023/0133647 A1      May 4, 2023

Related U.S. Application Data

(60) Provisional application No. 63/263,201, filed on Oct. 28, 2021.

(51) Int. Cl.
| | |
|---|---|
| *G01B 11/25* | (2006.01) |
| *H01S 5/00* | (2006.01) |
| *H01S 5/42* | (2006.01) |

(52) U.S. Cl.
CPC .......... *G01B 11/2513* (2013.01); *H01S 5/005* (2013.01); *H01S 5/423* (2013.01)

(58) Field of Classification Search
CPC ........ G02B 27/0172; G02B 2027/0178; G02B 26/0833; G02B 26/0858; G02B 26/10; G02B 26/101; G02B 26/105; G02B 27/0093; G02B 27/0916; G02B 19/0057; G02B 2027/0187; G02B 27/0977; G02B 26/08; G02B 27/286; G02B 6/12; G02B 2027/0138; G02B 2027/014; G02B 27/0176; G02B 13/16; G02B 2027/0123; G02B 27/0955; G02B 27/30; G02B 27/4205; G02B 26/0875; G02B 27/0081; G02B 27/283; G02B 27/46; G02B 30/27; G02B 30/30; G02B 5/201; G02B 5/285; G02B 5/288; G02B 17/086; G02B 2006/12107; G02B 2006/12121; G02B 2006/12123; G02B 2027/0156;
(Continued)

(56) References Cited

U.S. PATENT DOCUMENTS

| | | |
|---|---|---|
| 7,002,613 B2 | 2/2006 | Beier et al. |
| 7,626,744 B2 | 12/2009 | Arai et al. |
(Continued)

FOREIGN PATENT DOCUMENTS

| | | | | |
|---|---|---|---|---|
| CN | 107748475 A | * | 3/2018 | ............ G03B 21/20 |
| CN | 108594455 A | * | 9/2018 | ......... G02B 27/4205 |
(Continued)

*Primary Examiner* — Michael P Stafira
(74) *Attorney, Agent, or Firm* — Harrity & Harrity, LLP

(57) ABSTRACT

A structured light system includes a camera module and a dot projection module. The dot projection module includes a submount, an emitter array disposed on the submount, and a diffractive optical element (DOE) disposed over the emitter array. The emitter array includes a plurality of emitters arranged in a periodic emitter pattern and the emitter array is oriented at a non-zero angle relative to a rectilinear axis of the submount.

20 Claims, 3 Drawing Sheets

(58) Field of Classification Search

CPC .................... G02B 2027/0174; G02B 27/141; G02B 5/04; G02B 26/0816; G02B 27/106; G02B 27/425; G02B 6/34; G02B 7/04; G02B 2006/0098; G02B 21/0032; G02B 21/0036; G02B 21/0076; G02B 21/008; G02B 21/02; G02B 26/12; G02B 27/017; G02B 27/02; G02B 27/095; G02B 6/04; G02B 6/29343; G02B 6/29344; G02B 13/0095; G02B 13/04; G02B 13/06; G02B 13/22; G02B 2027/0132; G02B 21/006; G02B 3/0056; G02B 5/18; G02B 5/30; G02B 5/3016; G02B 5/3083; G02B 6/4202; G02B 6/423; G02B 6/4239; G02B 17/0615; G02B 17/0636; G02B 2027/011; G02B 26/123; G02B 26/124; G02B 26/127; G02B 27/0103; G02B 27/0179; G02B 27/0927; G02B 1/002; G02B 17/008; G02B 2027/0118; G02B 2027/0125; G02B 2027/013; G02B 2027/0141; G02B 26/00; G02B 27/0075; G02B 27/285; G02B 27/4261; G02B 27/48; G02B 27/58; G02B 3/00; G02B 3/0037; G02B 5/003; G02B 5/005; G02B 5/02; G02B 5/32; G02B 6/0016; G02B 6/105; G02B 6/12002; G02B 6/12004; G02B 6/12007; G02B 6/1225; G02B 6/124; G02B 6/131; G02B 7/02; G02B 7/182; G02B 1/02; G02B 1/10; G02B 1/11; G02B 13/0065; G02B 2027/0107; G02B 2027/0112; G02B 2027/0116; G02B 2027/0181; G02B 21/32; G02B 26/103; G02B 26/125; G02B 26/128; G02B 27/145; G02B 27/4222; G02B 5/0221; G02B 5/0278; G02B 5/045; G02B 5/09; G02B 5/12; G02B 5/122; G02B 5/1857; G02B 5/1861; G02B 5/20; G02B 6/0013; G02B 6/0035; G02B 6/0036; G02B 6/0038; G02B 6/0065; G02B 6/022; G02B 6/122; G02B 6/32; G02B 6/327; G02B 6/3502; G02B 6/3504; G02B 6/3526; G02B 6/3528; G02B 6/3534; G02B 6/3556; G02B 6/356; G02B 6/3566; G02B 6/3578; G02B 6/3584; G02B 6/3644; G02B 6/3656; G02B 6/366; G02B 6/3672; G02B 6/3692; G02B 6/4226; G02B 7/023; G02B 7/1805; G01B 11/26; G01B 11/026; G01B 9/02004; G01B 9/02091; G01B 15/00; G01B 11/2513; G01B 11/25; G01B 11/002; G01B 9/02092; G01B 11/2504; G01B 2290/25; G01B 2290/45; G01B 2290/60; G01B 9/02029; G01B 9/02049; G01B 9/0207; G01B 11/2441; G01B 11/2531; G01B 11/272; G01B 21/042; G01B 5/0014; G01B 11/03; G01B 11/00; G01B 11/24; G01B 11/2545; G01B 5/004; G01B 9/02077

See application file for complete search history.

(56) References Cited

U.S. PATENT DOCUMENTS

| | | | |
|---|---|---|---|
| 8,358,892 B2 | 1/2013 | Oda et al. | |
| 8,749,796 B2 | 6/2014 | Pesach et al. | |
| 8,908,277 B2 | 12/2014 | Pesach et al. | |
| 9,091,413 B2 | 7/2015 | Petronius et al. | |
| 9,228,697 B2 | 1/2016 | Schneider et al. | |
| 9,553,423 B2 | 1/2017 | Chen et al. | |
| 9,736,459 B2 | 8/2017 | Mor et al. | |
| 9,740,019 B2 | 8/2017 | Mor | |
| 9,825,425 B2 * | 11/2017 | Mor .................. G01B 11/2513 | |
| 10,288,417 B2 | 5/2019 | Mor et al. | |
| 10,386,178 B2 | 8/2019 | Moench et al. | |
| 10,571,709 B2 | 2/2020 | Mor | |
| 10,690,488 B2 | 6/2020 | Pesach et al. | |
| 10,780,689 B2 | 9/2020 | Landa et al. | |
| 10,928,642 B2 * | 2/2021 | Bakin ............... G02B 27/0905 | |
| 11,060,851 B2 | 7/2021 | Pesach et al. | |
| 2015/0097947 A1 * | 4/2015 | Hudman .............. G01S 7/4863 348/136 | |
| 2018/0063390 A1 * | 3/2018 | Trail ...................... G06V 40/20 | |
| 2019/0364226 A1 * | 11/2019 | Zheng .................... F21V 21/30 | |
| 2021/0152705 A1 | 5/2021 | Kudo | |
| 2021/0311379 A1 | 10/2021 | Park et al. | |
| 2021/0399530 A1 * | 12/2021 | Shirazi Hosseini Dokht .............. G03B 21/2033 | |

FOREIGN PATENT DOCUMENTS

| | | | | |
|---|---|---|---|---|
| WO | WO-2019045645 A1 * | 3/2019 | ............. | G02B 27/20 |
| WO | WO-2019086003 A1 * | 5/2019 | ........... | G03B 21/206 |

* cited by examiner

NON-ZERO ANGLE ORIENTATION OF AN EMITTER ARRAY RELATIVE TO A RECTILINEAR AXIS OF A SUBMOUNT

RELATED APPLICATION

This application claims priority to U.S. Provisional Patent Application No. 63/263,201, filed on Oct. 28, 2021, and entitled "DOT PROJECTOR PATTERN RANDOMNESS BY INTRODUCING A ROTATION ANGLE RELATIVE TO CAMERA AXES," the content of which is incorporated by reference herein in its entirety.

TECHNICAL FIELD

The present disclosure relates generally to a structured light system and to a dot projection module of the structured light system.

BACKGROUND

A structured light system may include an emitter array (e.g., a vertical-cavity surface-emitting laser (VCSEL) array), a lens, and a diffractive optical element (DOE). In operation, light emitted by emitters of the emitter array is collimated by the lens, and beams of collimated light (each corresponding to a respective emitter) are directed to the DOE. The DOE distributes the collimated beams of light in order to create a dot projection (e.g., a projection of the collimated beams). More specifically, the DOE diffracts a given beam of light such that diffracted orders of the given beam are transmitted by the DOE at different angles. An angular extent of the diffraction occurs over a range of angles relative to a surface of the DOE referred to as a field of view (FOV). The FOV can be, for example, a 60 degree FOV, a 90 degree FOV, or the like. These differently directed diffracted orders form a dot projection (e.g., that includes thousands or tens of thousands of spots) in the FOV.

SUMMARY

In some implementations, a structured light system includes a camera module; and a dot projection module that includes: a submount, an emitter array disposed on the submount, and a diffractive optical element (DOE) disposed over the emitter array, wherein: the emitter array includes a plurality of emitters arranged in a periodic emitter pattern, and the emitter array is oriented at a first non-zero angle relative to a rectilinear axis of the submount.

In some implementations, a dot projection module includes a submount; and an emitter array disposed on the submount, wherein: the emitter array includes a plurality of emitters arranged in a periodic emitter pattern, and the emitter array is oriented at a first non-zero angle relative to a rectilinear axis of the submount.

In some implementations, a structured light system includes a camera module; and a dot projection module configured to generate a dot projection, wherein: the dot projection includes a plurality of dots that corresponds to a periodic emitter pattern of a plurality of emitters of an emitter array of the dot projection module; and the dot projection is oriented at a first non-zero angle relative to a rectilinear axis of a field of view of the camera module.

DETAILED DESCRIPTION

Figure 1:
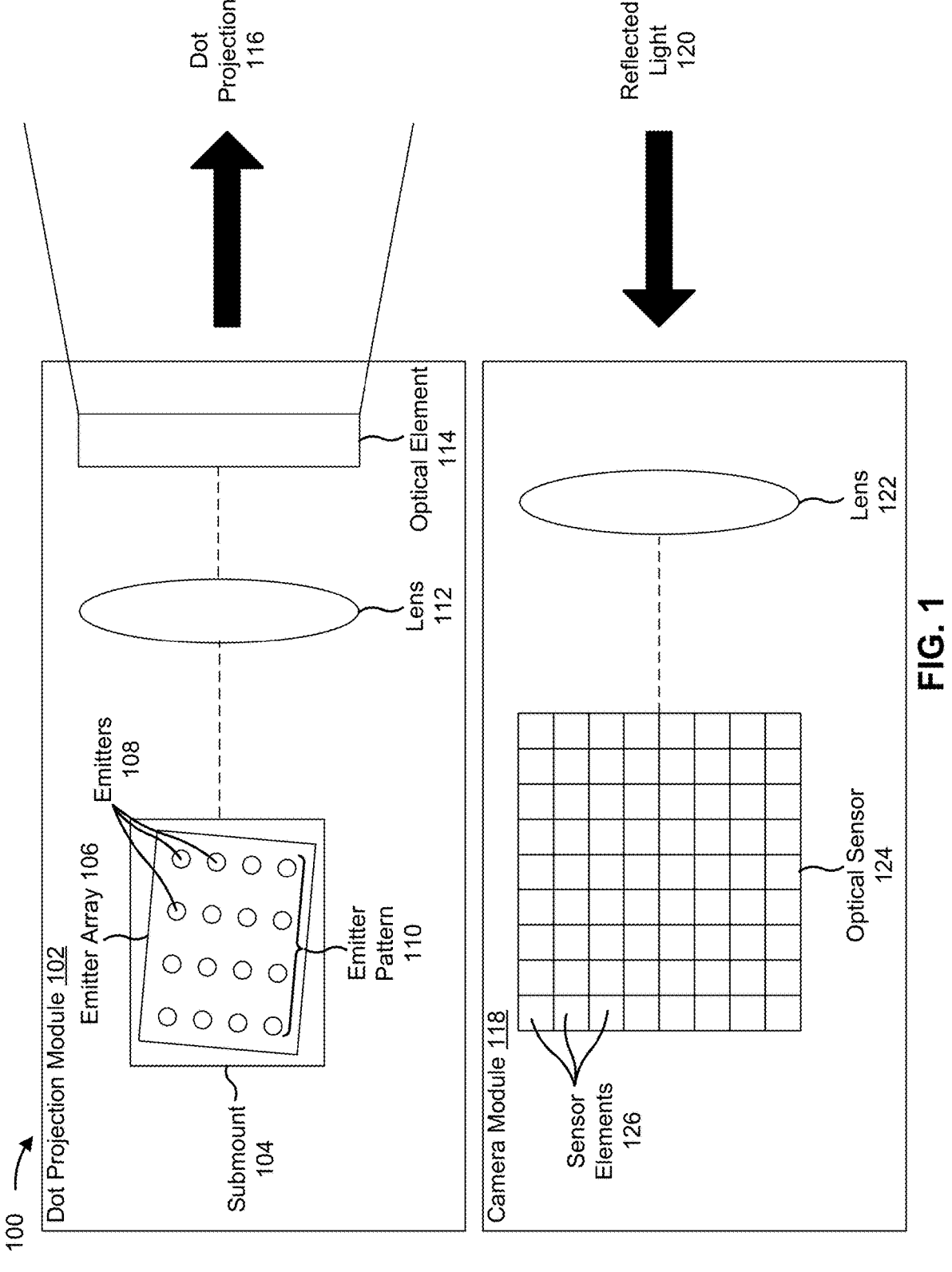
FIG. 1 is a diagram of an example structured light device described herein.

The following detailed description of example implementations refers to the accompanying drawings. The same reference numbers in different drawings may identify the same or similar elements.

A three-dimensional (3D) sensing time of flight (ToF) device, such as a ToF camera, may include an emitter array (e.g., a vertical-cavity surface-emitting laser (VCSEL) array), a lens, and a diffractive optical element (DOE). In operation, light emitted by emitters of the emitter array (e.g., infrared (IR) light) is collimated by the lens, and beams of collimated light (each corresponding to a respective emitter) are directed to the optical element. The optical element distributes the collimated beams of light to create a dot projection (e.g., a projection of the collimated beams) on a subject. More specifically, the optical element diffracts a given beam of light such that diffracted orders of the given beam are transmitted at different angles. The 3D sensing ToF device may include one or more additional elements (e.g., one or more sensors and/or processors) to sense the dot projection and make one or more measurements concerning the subject based on the dot projection.

In many cases, non-uniformity of dots of the dot projection in x and y directions of a field of view (FOV) of a ToF camera facilitates the one or more additional elements in obtaining accurate measurements concerning the subject. For example, a spacing between dots and/or a placement of a dots along (or parallel to) an axis of the FOV of the ToF camera should be non-uniform. Typically, this is achieved by randomizing locations of emitters within the emitter array. However, to obtain a particular dot count, an optical element (e.g., a DOE and/or a diffuser) is required to generate multiple high order tiles of a zero-order pattern (e.g., a projection of dots associated with the emitter array when no DOE and/or diffuser is present). Repeat tiling of the zero-order pattern reduces a non-uniformity of an overall dot pattern of the dot projection as the zero-order pattern is repeated multiple times along x and y axes of the FOV of the ToF camera. In some cases, the tiles may be shifted to increase a non-uniformity of the overall dot pattern, but only in one direction (e.g., along a particular axis and not along another axis).

Some implementations described herein provide a structured light system that includes a camera module and a dot projection module. The dot projection module includes a submount, an emitter array disposed on the submount, a lens disposed over the emitter array, and a DOE disposed over the lens and the emitter array. The emitter array includes a plurality of emitters arranged in a periodic emitter pattern (e.g., a two-dimensional periodic pattern) and the emitter array is oriented at a non-zero angle relative to a rectilinear axis of the submount. Accordingly, the dot projection module generates a dot projection (e.g., from light emitted by the plurality of emitters of the emitter array). The dot projection comprises a plurality of tiles, wherein each tile comprises a plurality of dots that conform to a periodic dot pattern that corresponds to the periodic emitter pattern (e.g., each dot of the periodic dot pattern is associated with an emitter of the emitter pattern). In some implementations, the dot projection 116 is oriented at a non-zero angle relative to one or more rectilinear axes of an FOV of the camera module.

In this way, some implementations described herein increase a non-uniformity of a dot projection in x and y directions of the FOV of the camera module. Accordingly, the dot projection is more heterogeneous in x and y directions of the FOV of the camera module than that produced using a conventional emitter array (e.g., that does not have a non-zero angle orientation), which allows the camera module to obtain a more accurate measurement of a subject illuminated by the dot projection.

FIG. 1 is a diagram of an example structured light device 100 described herein. As shown in FIG. 1, a structured light device 100 may include a dot projection module 102. The dot projection module 102, may include, for example, a submount 104, an emitter array 106 that includes a plurality of emitters 108 (e.g., arranged in an emitter pattern 110), a lens 112, and/or an optical element 114.

The plurality of emitters 108 of the emitter array 106 may be configured to emit light and may include, for example, a plurality of light emitting diodes (LEDs), a plurality of vertical-cavity surface-emitting lasers (VCSELs), a plurality of other types of vertical emitting (e.g., top emitting or bottom emitting) laser devices, and/or other types of light emitting devices. The plurality of emitters 108 may be arranged in the emitter pattern 110 (e.g., in a surface of a chip of the emitter array 106), which is further described herein in relation to FIG. 2.

The submount 104 may include a structure to hold the emitter array 106 (e.g., within an internal portion of the dot projection module 102). The submount 104 may include, for example, a structure (e.g., that comprises a metal material, a dielectric material, a semiconductor material, or another material) that is configured to attach to the chip of the emitter array 106. The chip of the emitter array 106 may include, for example, a polymer dielectric material, such as FR4 (e.g., a flame resistant or self-extinguishing composite material made from woven fiberglass cloth with an epoxy resin binder), a ceramic material (e.g., a high temperature co-fired ceramic (HTCC) material or a low temperature co-fired ceramic (LTCC) material), a semiconductor material (e.g., that includes gallium arsenide (GaAs), indium phosphide (InP), and/or germanium (Ge)), or another material. As shown in FIG. 1, and as further described herein in relation to FIG. 2, the emitter array 106 may be disposed on the submount 104 and may be oriented at a non-zero angle relative to a rectilinear axis of the submount 104.

The lens 112 may include a glass lens, a polymer lens, or another lens and may be configured to collimate light (e.g., that was emitted by the plurality of emitters 108) and/or direct the light to the optical element 114. The optical element 114 may include a diffractive optical element (DOE), a diffuser, and/or a similar optical element and may be configured to diffract light (e.g., that was emitted by the plurality of emitters 108 and/or directed to the optical element 114 by the lens 112). The lens 112 may be disposed over the emitter array 106 and the optical element 114 may be disposed over the emitter array 106 and/or the emitter array 106. For example, as shown in FIG. 1, the optical element 114, the lens 112, and the emitter array 106 may be aligned in a "stack" (e.g., where the optical element 114, the lens 112, and the emitter array 106 are aligned with a reference line, such as an optical axis of the lens 112).

In some implementations, the dot projection module 102 may be configured to generate a dot projection 116 (e.g., from light emitted by the plurality of emitters 108 of the emitter array 106). For example, the plurality of emitters 108 of the emitter array 106 may be configured to emit light, the lens 112 may be configured to collimate the light and/or direct the light to the optical element 114, and the optical element 114 may be configured to generate the dot projection 116 across a scene (e.g., that includes a target and/or an object). The dot projection 116 may comprise a plurality of tiles, wherein each tile comprises a plurality of dots that conform to a dot pattern that corresponds to the emitter pattern 110 (e.g., each dot of the dot pattern is associated with an emitter 108 of the emitter pattern 110). The dot projection 116 is further described herein in relation to FIG. 3.

In some implementations, the structured light device 100 may include a camera module 118. The camera module 118 may be configured to detect reflected light 120 (e.g., light of the dot projection 116 that is reflected by the scene to the camera module 118). The camera module 118 may include a lens 122 and/or an optical sensor 124. The lens 122 may include a glass lens, a polymer lens, or another lens and may be configured to focus light (e.g., the reflected light 120) and/or direct the light to the optical sensor 124. The optical sensor 124 may include a plurality of sensor elements 126. A sensor element 126 may be configured to obtain information regarding a light beam (e.g., of the reflected light) that falls incident on the sensor element 126 (e.g., after being focused and/or directed by the lens 122). Accordingly, the optical sensor 124 may be configured to collect information obtained by the plurality of sensor elements 126 to generate sensor data associated with the scene (e.g., to measure the target and/or the object).

The lens 122 may be disposed over the optical sensor 124. For example, the lens 122 and the optical sensor 124 may be aligned in a "stack" (e.g., where the lens 122 and the optical sensor 124 are aligned with a reference line, such as an optical axis of the lens 122).

As indicated above, FIG. 1 is provided as an example. Other examples may differ from what is described with regard to FIG. 1.

Figure 2:
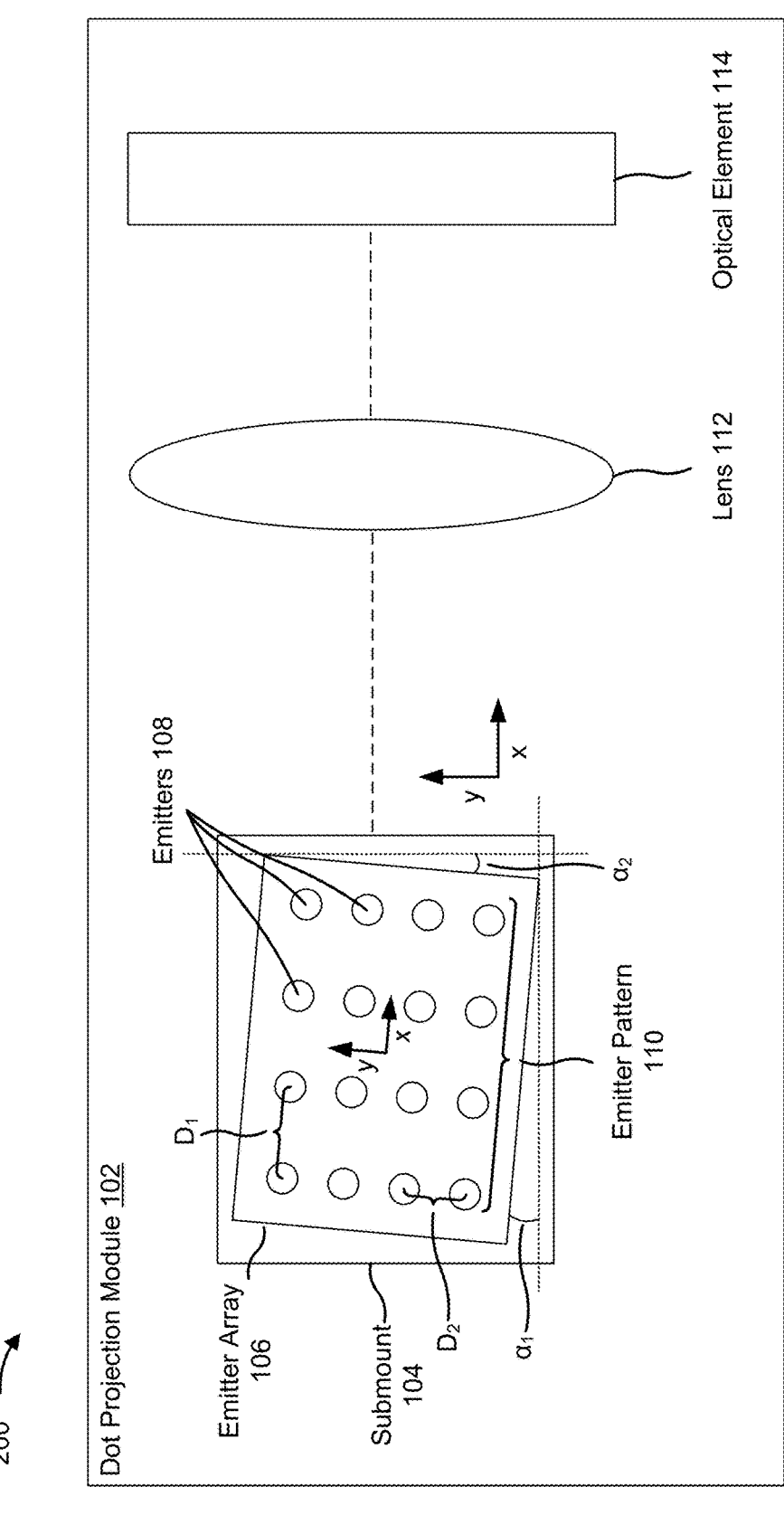
FIG. 2 is a diagram of an example configuration of a dot projection module described herein.

FIG. 2 is a diagram 200 of an example configuration of the dot projection module 102 described herein. As shown in FIG. 2, the dot projection module 102 may include the submount 104, the emitter array 106 that includes the plurality of emitters 108, the lens 112, and/or the optical element 114 (e.g., as described herein in relation to FIG. 1).

As further shown in FIG. 2, the emitter array 106 may be arranged in the emitter pattern 110. In some implementations, the emitter pattern 110 may be a periodic emitter pattern, such as an oblique two-dimensional emitter pattern, a rectangular two-dimensional emitter pattern, a centered rectangular two-dimensional emitter pattern, a square two-dimensional emitter pattern, a hexagonal two-dimensional emitter pattern, and/or another periodic two-dimensional emitter pattern. Accordingly, in some implementations, the emitter pattern 110 may correspond to a monoclinic two-dimensional Bravais lattice, an orthorhombic two-dimensional Bravais lattice, a tetragonal two-dimensional Bravais lattice, and/or a hexagonal two-dimensional Bravais lattice.

As further shown in FIG. 2, the emitter pattern 110 may be aligned with one or more rectilinear axes (shown in FIG. 2 as an x-axis and a y-axis) of the emitter array 106 (e.g., of the chip of the emitter array 106). Accordingly, the emitter pattern 110 may have an emitter pitch $D_1$ in an x-direction of the emitter array 106 (e.g., a distance $D_1$ between adjacent emitters 108 in the x-direction of the emitter array 106) and/or an emitter pitch $D_2$ in a y-direction of the emitter array 106 (e.g., a distance $D_2$ between adjacent emitters 108 in the y-direction of the emitter array 106). In some implementations, the emitter pitch $D_1$ in the x-direction of the emitter array 106 may match the emitter pitch $D_2$ in the y-direction of the emitter array 106 (e.g., the emitter pitch $D_1$ in the x-direction of the emitter array 106 is equal to the emitter pitch $D_2$ in the y-direction of the emitter array 106 within a tolerance, which may be less than or equal to 10 nanometers (nm)), or, alternatively, the emitter pitch $D_1$ in the x-direction of the emitter array 106 may differ from the emitter pitch $D_2$ in the y-direction of the emitter array 106 (e.g., a difference between the emitter pitch $D_1$ in the x-direction of the emitter array 106 the emitter pitch $D_2$ in the y-direction of the emitter array 106 is greater than 10 nm).

As further shown in FIG. 2, the emitter array 106 (e.g., the chip of the emitter array 106) may be oriented at a non-zero angle relative to one or more rectilinear axes of the submount 104 (shown in FIG. 2 as an x-axis and a y-axis). For example, as shown in FIG. 2, the emitter array 106 may be oriented at a non-zero angle αi relative to the x-axis of the submount 104 and may be oriented at a non-zero angle $\alpha_2$ relative to the y-axis of the submount 104. When the emitter array 106 has a rectangular shape (e.g., the emitter array 106 has four sides, such as with internal right angles, as shown in FIG. 2), the non-zero angle $\alpha_1$ may match (e.g., be equal to within a tolerance, which may be less than or equal to 1 degree) the non-zero angle $\alpha_2$. Each of the non-zero angle $\alpha_1$ and the non-zero angle $\alpha_2$ may be between 2 degrees and 30 degrees (e.g., greater than or equal to 2 degrees and less than or equal to 30 degrees). In some implementations, when the emitter pattern 110 is aligned with one or more rectilinear axes of the emitter array 106, the plurality of emitters 108 and/or the emitter pattern 110 may be oriented at a non-zero angle relative to one or more rectilinear axes of the submount 104. For example, the plurality of emitters 108 and/or the emitter pattern 110 may be oriented at the non-zero angle $\alpha_1$ relative to the x-axis of the submount 104 and may be oriented at the non-zero angle $\alpha_2$ relative to the y-axis of the submount 104.

Additionally, or alternatively, the optical element 114 may be oriented at a non-zero angle relative to the one or more rectilinear axes of the submount 104. For example, when the optical element 114 has a rectangular shape (e.g., the optical element 114 has four sides, such as with internal right angles), one or more rectilinear axes of the optical element 114 may be respectively aligned with one or more rectilinear axes of the emitter array 106 (e.g., the optical element 114 may be oriented at an approximately zero angle relative to the one or more rectilinear axes of the emitter array 106, such as zero degrees within a tolerance, which may be less than or equal to 1 degree). Accordingly, the optical element 114 may be oriented at a same non-zero angle relative to the one or more rectilinear axes of the submount 104 as that of the emitter array 106.

As indicated above, FIG. 2 is provided as an example. Other examples may differ from what is described with regard to FIG. 2.

Figure 3:
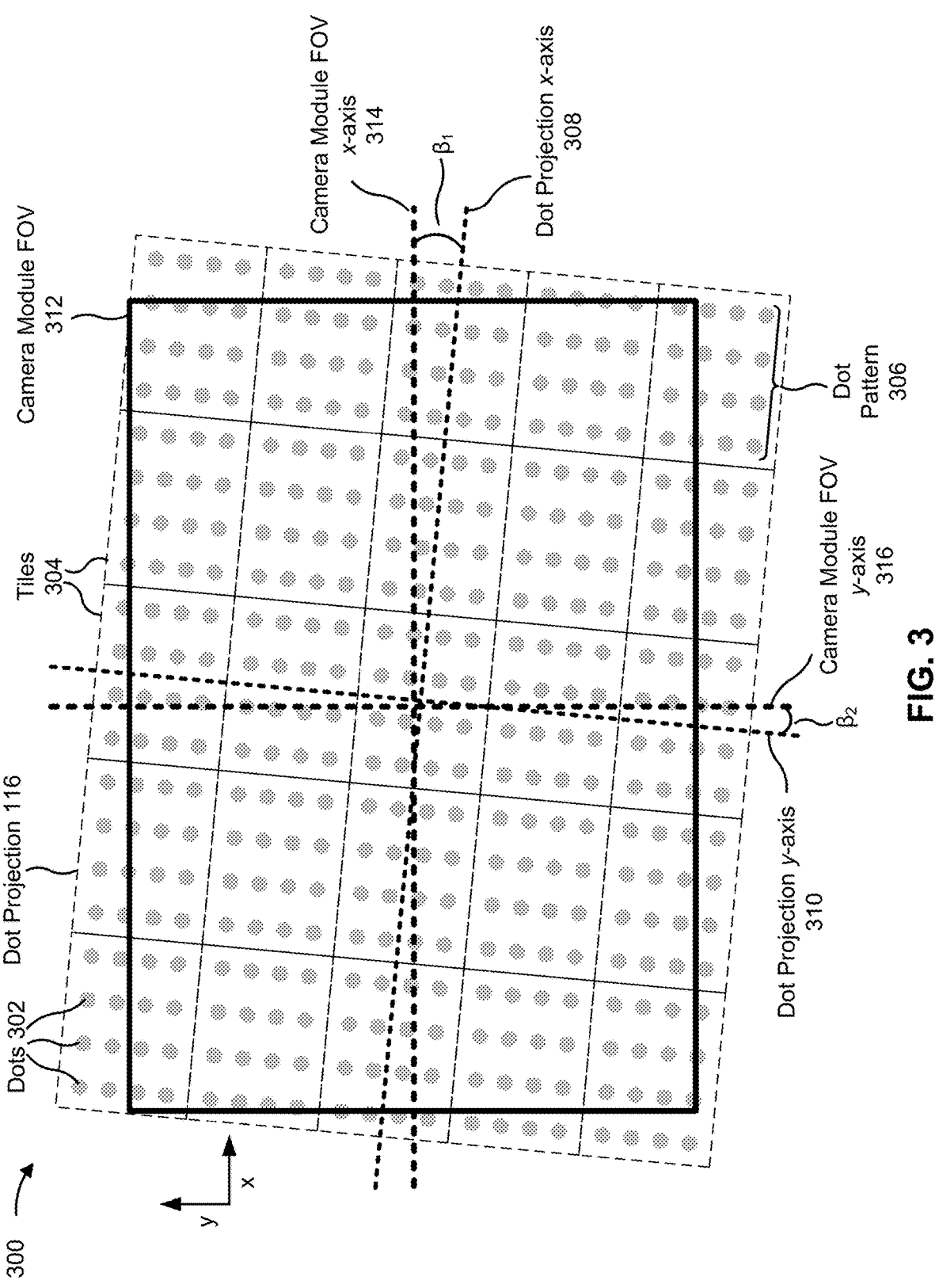
FIG. 3 is a diagram of an example configuration of a dot projection herein.

FIG. 3 is a diagram 300 of an example configuration of the dot projection 116 described herein. The dot projection 116 may be generated by the dot projection module 102 from light emitted by the plurality of emitters 108 of the emitter array 106 (e.g., as described elsewhere herein).

As shown in FIG. 3, the dot projection 116 may include a plurality of dots 302. The plurality of dots 302 may correspond to the emitter pattern 110 of the plurality of emitters 108 of the emitter array 106 of the dot projection module 102 (e.g., as described herein in relation to FIGS. 1 and 2). For example, the dot projection 116 may comprise a plurality of tiles 304 (e.g., arranged in a two-dimensional array of tiles), wherein each tile 304 may include a subset of dots 302 of the plurality of dots 302. The subset of dots 302 may conform to a dot pattern 306 that corresponds to the emitter pattern 110 of the plurality of emitters 108 of the emitter array 106 (e.g., each dot 302 of the dot pattern 306 is associated with an emitter 108 of the emitter pattern 110). For example, a tile 304 may be an optical projection of the emitter pattern 110, and, accordingly, the dot pattern 306 (e.g., as shown in FIG. 3) may include a same number and arrangement of dots 302 as that of the plurality of emitters 108 of the emitter pattern 110 (e.g., as shown in FIGS. 1 and 2). In this way, the dot pattern 306 may be a periodic dot pattern, such as an oblique two-dimensional dot pattern, a rectangular two-dimensional dot pattern, a centered rectangular two-dimensional dot pattern, a square two-dimensional dot pattern, a hexagonal two-dimensional dot pattern, and/or another periodic two-dimensional dot pattern. Accordingly, in some implementations, the dot pattern 306 may correspond to a monoclinic two-dimensional Bravais lattice, an orthorhombic two-dimensional Bravais lattice, a tetragonal two-dimensional Bravais lattice, and/or a hexagonal two-dimensional Bravais lattice.

In some implementations, the dot projection 116 may have one or more rectilinear axes. For example, when the dot projection 116 has a rectangular shape (e.g., the dot projection 116 has four sides, such as with internal right angles, as shown in FIG. 3), the dot projection 116 may include a dot projection x-axis 308 and a dot projection y-axis 310. Accordingly, the plurality of dots 302 and/or the plurality of tiles 304 may be aligned with the one or more rectilinear axes of the dot projection 116. Moreover, each dot pattern 306 of the plurality of tiles 304 may be aligned with the one or more rectilinear axes of the dot projection 116.

As further shown in FIG. 3, the dot projection 116 may be at least partially coextensive with a field of view (FOV) 312 of the camera module 118 (e.g., a FOV of detection of the camera module 118). The camera module FOV 312 may have one or more rectilinear axes. For example, when the camera module FOV 312 has a rectangular shape (e.g., the camera module FOV 312 has four sides, such as with internal right angles, as shown in FIG. 3), the camera module FOV 312 may include a camera module FOV x-axis 314 and a camera module FOV y-axis 316.

In some implementations, the dot projection 116 may be oriented at a non-zero angle relative to one or more rectilinear axes of the camera module FOV 312 (shown in FIG. 3 as an x-axis and a y-axis). For example, as shown in FIG. 3, the dot projection 116 may be oriented at a non-zero angle $\beta_1$ relative to the camera module FOV x-axis 314 and may be oriented at a non-zero angle $\beta_2$ relative to camera module FOV y-axis 316. When the dot projection 116 has a rectangular shape (e.g., the dot projection 116 has four sides, such as with internal right angles, as shown in FIG. 3), the non-zero angle $\beta_1$ may match the non-zero angle $\beta_2$ (e.g., be equal to within a tolerance, which may be less than or equal to 1 degree). Each of the non-zero angle $\beta_1$ and the non-zero angle $\beta_2$ may be between 2 degrees and 30 degrees (e.g., greater than or equal to 2 degrees and less than or equal to 30 degrees). In some implementations (e.g., when the plurality of dots 302, the plurality of tiles 304, and/or the dot pattern 306 of each tile 304 are aligned with one or more rectilinear axes of the dot projection 116), the plurality of dots 302, the plurality of tiles 304, and/or the dot pattern 306 of each tile 304 may be oriented at a non-zero angle relative to one or more rectilinear axes of the camera module FOV 312. For example, the plurality of dots 302, the plurality of tiles 304, and/or the dot pattern 306 of each tile 304 may be oriented at the non-zero angle $\beta_1$ relative to the camera module FOV x-axis 314 and may be oriented at the non-zero angle $\beta_2$ relative to camera module FOV y-axis 316.

In some implementations, the non-zero angle of the dot projection 116 may match (e.g., be equal to within a tolerance, which may be less than or equal to 1 degree) the non-zero angle of the emitter array 106. For example, the non-zero angle $\beta_1$ may be equal to the non-zero angle $\alpha_1$ and/or the non-zero angle $\beta_2$ may be equal to the non-zero angle $\alpha_2$. Accordingly, any two (or more) of the respective non-zero angles of the emitter array 106, the plurality of emitters 108, the emitter pattern 110, the optical element 114, the dot projection 116, the plurality of dots 302, the plurality of tiles 304, and/or the dot pattern 306 of each tile 304, may match (e.g., be equal to within a tolerance, which may be less than or equal to 1 degree) each other.

As indicated above, FIG. 3 is provided as an example. Other examples may differ from what is described with regard to FIG. 3.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A structured light system, comprising:
a camera module; and
a dot projection module that includes:
   a submount,
   an emitter array disposed on the submount, and
   a diffractive optical element (DOE) disposed over the emitter array, wherein:
      the emitter array includes a plurality of emitters arranged in a periodic emitter pattern, and
      the emitter array is oriented at a first non-zero angle relative to a rectilinear axis of the submount.

2. The structured light system of claim 1,
wherein the DOE is oriented at a second non-zero angle relative to the rectilinear axis of the submount,
   wherein a difference between the first non-zero angle of the emitter array and the second non-zero angle of the DOE is less than a tolerance.

3. The structured light system of claim 1,
wherein a first emitter pitch of the periodic emitter pattern in an x-direction of rectilinear axes of the emitter array differs from a second emitter pitch of the periodic emitter pattern in a y-direction of the rectilinear axes of the emitter array.

4. The structured light system of claim 1,
wherein a first emitter pitch of the periodic emitter pattern in an x-direction of rectilinear axes of the emitter array matches a second emitter pitch of the periodic emitter pattern in a y-direction of the rectilinear axes of the emitter array.

5. The structured light system of claim 1,
wherein the periodic emitter pattern includes at least one of:
   an oblique two-dimensional emitter pattern;
   a rectangular two-dimensional emitter pattern;
   a centered rectangular two-dimensional emitter pattern;
   a square two-dimensional emitter pattern; or
   a hexagonal two-dimensional emitter pattern.

6. The structured light system of claim 1,
wherein the first non-zero angle is between 2 degrees and 30 degrees.

7. The structured light system of claim 1,
wherein the dot projection module is configured to generate a dot projection from light emitted by the plurality of emitters of the emitter array, wherein:
   the dot projection includes a plurality of dots that corresponds to the periodic emitter pattern; and
   the dot projection is oriented at a second non-zero angle relative to a rectilinear axis of a field of view of the camera module.

8. The structured light system of claim 1,
wherein the dot projection module is configured to generate a dot projection from light emitted by the plurality of emitters of the emitter array, wherein:
   the dot projection comprises a plurality of tiles; and
   each tile, of the plurality of tiles, includes a plurality of dots that conforms to a dot pattern that corresponds to the periodic emitter pattern, wherein the dot pattern is oriented at a second non-zero angle relative to a rectilinear axis of a field of view of the camera module.

9. A structured light system, comprising:

a camera module; and a dot projection module configured to generate a dot projection, wherein:

the dot projection includes a plurality of dots that corresponds to a periodic emitter pattern of a plurality of emitters of an emitter array of the dot projection module; and the dot projection is oriented at a first non-zero angle relative to a rectilinear axis of a field of view of the camera module.

10. The structured light system of claim 9, wherein the first non-zero angle is between 2 degrees and 30 degrees.

11. The structured light system of claim 9, wherein the dot projection module includes the emitter array and a submount, wherein:

the emitter array is disposed on the submount; and the emitter array is oriented at a second non-zero angle relative to a rectilinear axis of the submount.

12. The structured light system of claim 11, wherein the first non-zero angle of the dot projection matches the second non-zero angle of the emitter array.

13. The structured light system of claim 11, wherein the dot projection module further includes a diffractive optical element (DOE) disposed over the emitter array, wherein:

the DOE is oriented at approximately a zero angle relative to a rectilinear axis of the emitter array.

14. The structured light system of claim 9, wherein:

the dot projection comprises a plurality of tiles;

each tile, of the plurality of tiles, includes a subset of dots of the plurality of dots; and each tile, of the plurality of tiles, is oriented at a second non-zero angle relative to the rectilinear axis of the field of view of the camera module.

15. The structured light system of claim 14, wherein:

the subset of dots conforms to a dot pattern that corresponds to the periodic emitter pattern; and the dot pattern is oriented at a second non-zero angle relative to the rectilinear axis of the field of view of the camera module.

16. A method, comprising:

generating, by a dot projection module of a system, a dot projection, wherein:

the dot projection includes a plurality of dots that corresponds to a periodic emitter pattern of a plurality of emitters of an emitter array of the dot projection module; and the dot projection is oriented at a first non-zero angle relative to a rectilinear axis of a field of view of a camera module of the system.

17. The method of claim 16, wherein the first non-zero angle is between 2 degrees and 30 degrees.

18. The method of claim 16, wherein the dot projection module includes the emitter array and a submount, wherein:

the emitter array is disposed on the submount; and the emitter array is oriented at a second non-zero angle relative to a rectilinear axis of the submount.

19. The method of claim 18, wherein the first non-zero angle of the dot projection matches the second non-zero angle of the emitter array.

20. The method of claim 16, wherein the dot projection module further includes a diffractive optical element (DOE) disposed over the emitter array, wherein:

the DOE is oriented at approximately a zero angle relative to a rectilinear axis of the emitter array.

* * * * *